(12) United States Patent
Yuan et al.

(10) Patent No.: US 12,033,424 B2
(45) Date of Patent: Jul. 9, 2024

(54) LIGHT-SENSITIVE SENSOR, ARRAY SUBSTRATE, AND ELECTRONIC EQUIPMENT

(71) Applicant: WUHAN CHINA STAR OPTOELECTRONICS TECHNOLOGY CO., LTD., Wuhan (CN)

(72) Inventors: Jianfeng Yuan, Wuhan (CN); Fan Gong, Wuhan (CN); Fei Ai, Wuhan (CN); Jiyue Song, Wuhan (CN); Dewei Song, Wuhan (CN); Shiyu Long, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 590 days.

(21) Appl. No.: 17/052,110

(22) PCT Filed: Aug. 14, 2020

(86) PCT No.: PCT/CN2020/109244
§ 371 (c)(1),
(2) Date: Oct. 30, 2020

(87) PCT Pub. No.: WO2022/016637
PCT Pub. Date: Jan. 27, 2022

(65) Prior Publication Data
US 2023/0112653 A1 Apr. 13, 2023

(30) Foreign Application Priority Data
Jul. 21, 2020 (CN) .......................... 202010706950.1

(51) Int. Cl.
*G06V 40/13* (2022.01)
*G02F 1/1333* (2006.01)
(Continued)

(52) U.S. Cl.
CPC ...... *G06V 40/1318* (2022.01); *G02F 1/13338* (2013.01); *G02F 1/133514* (2013.01);
(Continued)

(58) Field of Classification Search
CPC ............ G06V 40/1318; G02F 1/13338; G02F 1/133514; G02F 1/1339; G02F 1/134309;
(Continued)

(56) References Cited

U.S. PATENT DOCUMENTS

2010/0025677 A1* 2/2010 Yamazaki ......... H01L 29/78606
204/192.1
2018/0165496 A1* 6/2018 Cheng ........................ G09F 9/00
2020/0183221 A1* 6/2020 Saitoh ................... G02F 1/1368

FOREIGN PATENT DOCUMENTS

CN 1470076 A 1/2004
CN 109728050 A 5/2019
(Continued)

OTHER PUBLICATIONS

International Search Report in International application No. PCT/CN2020/109244, dated Apr. 26, 2021.
(Continued)

*Primary Examiner* — Premal R Patel
(74) *Attorney, Agent, or Firm* — PV IP PC; Wei Te Chung; Zhigang Ma

(57) ABSTRACT

A light-sensitive sensor, an array substrate, and an electronic equipment are provided. The light-sensitive sensor includes a third metal layer, a second semiconductor layer, and a fourth metal layer. The third metal layer includes a second gate. The second semiconductor layer includes conductive
(Continued)

portions, and the conductive portions are disposed at both ends of the second semiconductor layer. The fourth metal layer disposed on the second semiconductor layer, and the fourth metal layer includes a second source and a second drain.

20 Claims, 5 Drawing Sheets

(51) Int. Cl.
| G02F 1/1335 | (2006.01) |
| G02F 1/1339 | (2006.01) |
| G02F 1/1343 | (2006.01) |
| G02F 1/1362 | (2006.01) |
| G02F 1/1368 | (2006.01) |
| G06F 3/041 | (2006.01) |
| G06F 3/044 | (2006.01) |
| H01L 31/0376 | (2006.01) |
| H01L 31/113 | (2006.01) |

(52) U.S. Cl.
CPC ...... *G02F 1/1339* (2013.01); *G02F 1/134309* (2013.01); *G02F 1/136286* (2013.01); *G02F 1/1368* (2013.01); *G06F 3/0412* (2013.01); *G06F 3/0445* (2019.05); *H01L 31/03762* (2013.01); *H01L 31/1136* (2013.01)

(58) Field of Classification Search
CPC ............. G02F 1/136286; G02F 1/1368; G06F 3/0412; G06F 3/0445; H01L 31/03762; H01L 31/1136
See application file for complete search history.

(56) References Cited

FOREIGN PATENT DOCUMENTS

| CN | 110690227 A | 1/2020 |
| CN | 111399265 A | 7/2020 |
| EP | 0361515 A2 | 4/1990 |
| JP | 2001042296 A | 2/2001 |
| JP | 2004109862 A | 4/2004 |
| JP | 2006186031 A | 7/2006 |
| JP | 2009135260 A | 6/2009 |
| JP | 2016092824 A | 5/2016 |
| KR | 20130060200 A | 6/2013 |
| WO | 2011135908 A1 | 11/2011 |

OTHER PUBLICATIONS

Written Opinion of the International Search Authority in International application No. PCT/CN2020/109244, dated Apr. 26, 2021.
Chinese Office Action issued in corresponding Chinese Patent Application No. 202010706950.1 dated May 14, 2023, pp. 1-7.
Eurasian Office Action issued in corresponding Eurasian Patent Application No. 202191095 dated Jan. 27, 2023, pp. 1-2.
Japanese Office Action issued in corresponding Japanese Patent Application No. 特願2021-534390 dated Nov. 1, 2022, pp. 1-4.
Korean Office Action issued in corresponding Korean Patent Application No. 10-2021-7025649 dated Jun. 21, 2023, pp. 1-7.

* cited by examiner

LIGHT-SENSITIVE SENSOR, ARRAY SUBSTRATE, AND ELECTRONIC EQUIPMENT

This application is a Notional Phase of PCT Patent Application No. PCT/CN2020/109244 having international filing date of Aug. 14, 2020, which claims priority to Chinese Patent Application with the application No. 202010706950.1 filed on Jul. 21, 2020 with the National Intellectual Property Administration, the disclosure of which is incorporated by reference in the present application in its entirety.

FIELD OF DISCLOSURE

The present disclosure relates to the field of display technologies, in particular to a light-sensitive sensor, an array substrate, and an electronic equipment.

BACKGROUND

A combination of an optical fingerprint technology and a display panel is currently one of main directions. Its principle is to use different intensity of light reflected from valleys and ridges of a fingerprint into a sensing area of the display panel, and to convert different light signals into electrical signals. The electrical signals are acquired through a chip to form a key fingerprint pattern to achieve a purpose of fingerprint recognition.

Light-sensitive sensors currently used in the display panel have poor noise immunity and sensitivity, thereby reducing accuracy of the fingerprint recognition.

SUMMARY OF DISCLOSURE

Embodiments of the present disclosure provide a light-sensitive sensor, an array substrate, and an electronic equipment, which can enhance anti-noise performance and sensitivity of the light-sensitive sensor, thereby improving accuracy of fingerprint recognition.

An embodiment of the present disclosure provides a light-sensitive sensor, including: a third metal layer, a second insulating layer, a second semiconductor layer, and a fourth metal layer.

The third metal layer includes a second gate.

The second insulating layer is disposed on the third metal layer.

The second semiconductor layer is disposed on the second insulating layer. The second semiconductor layer includes conductive portions, and the conductive portions are disposed at both ends of the second semiconductor layer. An orthographic projection of the second semiconductor layer on a setup plane partially overlaps an orthographic projection of the second gate on the setup plane.

The fourth metal layer is disposed on the second semiconductor layer, and the fourth metal layer includes a second source and a second drain.

An embodiment of the present disclosure provides an array substrate, including a base and the light-sensitive sensor mentioned above.

The base includes a control element.

The second drain of the light-sensitive sensor is connected to the control element.

An embodiment of the present disclosure further provides an electronic equipment, which includes the array substrate mentioned above.

The light-sensitive sensor, the array substrate, and the electronic equipment of the embodiments of the present disclosure include the third metal layer, the second insulating layer, the second semiconductor layer, and the fourth metal layer. The third metal layer includes the second gate. The second insulating layer is disposed on the third metal layer. The second semiconductor layer is disposed on the second insulating layer. The second semiconductor layer includes the conductive portions, and the conductive portions are disposed at both ends of the second semiconductor layer. The second gate covers a portion of the second semiconductor layer. The fourth metal layer is disposed on the second semiconductor layer. The fourth metal layer includes the second source and the second drain. Since there is a gap area between the second gate and the second source and/or the second drain that is not controlled by the gate, dark current of the light-sensitive sensor is reduced, anti-noise performance and sensitivity of the device are enhanced, and the accuracy of fingerprint recognition is improved.

BRIEF DESCRIPTION OF DRAWINGS

In order to more clearly describe the technical solutions in embodiments of the present disclosure, the following will briefly introduce the accompanying drawings needed in the description of the embodiments. Apparently, the accompanying drawings in the following description are only some embodiments of the present disclosure, for those skilled in the art, other drawings may be obtained based on these drawings without creative efforts.

DETAILED DESCRIPTION

Figure 1:
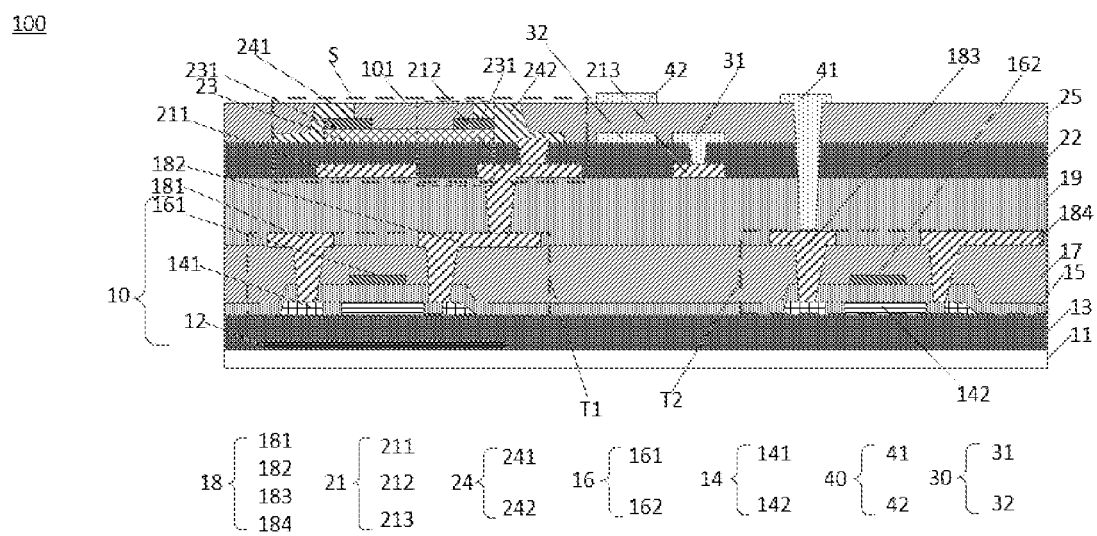
FIG. 1 is a schematic diagram of an array substrate of an embodiment of the present disclosure.

The following clearly and completely describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person skilled in the art based on the embodiments of the present disclosure without creative efforts shall fall within the protection scope of the present disclosure.

In the description of the present disclosure, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," "counterclockwise," and the like indicating an orientation or position relationship are based on an orientation or position relationship shown in the drawings, which is only intended to describe the present disclosure conveniently and simplify the description, but not for indicating or implying that the specific device or elements must be arranged in a particular orientation, or be constituted or operate in a particular orientation, and therefore shall not be understood as limiting the present disclosure. In addition, terms such as "first" and "second" are used herein for purposes of description and are not intended to indicate or imply relative importance or significance or to imply the number of indicated technical features. Thus, the feature defined with "first" and "second" may include one or more of this feature. In the description of the present disclosure, "a plurality of" means two or more than two, unless specified otherwise.

In the description of the present disclosure, it should be understood that, unless specified or limited otherwise, the terms "mounted," "connected," "coupled" and "fixed" and the like should be understood broadly. For example, a connection may be a fixed connection, a detachable connection, or an integral connection; or may be a mechanical connection or an electrical connection; or may be mutual communication; or may be a direct connection, an indirect connection implemented by using an intermediate medium; or may be internal connection between two elements or an interaction relationship between two elements. A person of ordinary skill in the art may understand specific meanings of the foregoing terms in the present disclosure in specific cases.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature. A first feature "below," "under," or "on bottom of" a second feature may include an embodiment in which the first feature is right or obliquely "below," "under," or "on bottom of" the second feature, or just means that the first feature is at a height lower than that of the second feature.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

Please refer to FIG. 1, which is a schematic diagram of an array substrate of an embodiment of the present disclosure.

As shown in FIG. 1, an array substrate 100 of the embodiment includes a base 10, a third metal layer 21, a second insulating layer 22, a second semiconductor layer 23, and a fourth metal layer 24.

The base 10 includes a control element T1. The control element T1 is also a thin film transistor. In an embodiment, the base 10 may include a base substrate 11, a first semiconductor layer 14, a first insulating layer 15, a first metal layer 16, and a second metal layer 18. In addition, the base 10 may further include at least one of a light shielding layer 12, a buffer layer 13, a gate insulating layer 17, and a planarization layer 19.

The base substrate 11 may be a glass substrate or a flexible substrate. Material of the base substrate 11 is selected from a group consisting of glass, silicon dioxide, polyethylene, polypropylene, polystyrene, polylactic acid, polyethylene terephthalate, polyimide, and polyurethane.

The light shielding layer 12 is disposed on the base substrate 11, and the light shielding layer 12 may be made of a metal material.

The buffer layer 13 is disposed on the light shielding layer 12, and material of the buffer layer 13 includes, but is not limited to, silicon nitride and silicon oxide.

The first semiconductor layer 14 is disposed on the buffer layer 13. In a preferred embodiment, the first semiconductor layer 14 may include a first semiconductor portion 141.

The first insulating layer 15 is disposed on the first semiconductor layer 14. Material of the first insulating layer 15 may be selected from a group consisting of silicon nitride, silicon oxide, and organic photoresist.

The first metal layer 16 is disposed on the first insulating layer 15. The first metal layer 16 includes a first gate 161. Material of the first metal layer 16 may be selected from a group consisting of copper, aluminum, and titanium.

The gate insulating layer 17 is disposed on the first metal layer 16, and material of the gate insulating layer 17 may be selected from a group consisting of silicon nitride, silicon oxide, and organic photoresist.

The second metal layer 18 is disposed on the gate insulating layer 17, and the second metal layer 18 includes a first source 181 and a first drain 182. Material of the second metal layer 18 may be the same as that of the first metal layer 16.

The planarization layer 19 is disposed on the second metal layer 18, and material of the planarization layer 19 may be the same as that of the gate insulating layer 17.

Furthermore, the array substrate also includes a light-sensitive sensors S. The light-sensitive sensor S includes a second gate 211, the second semiconductor layer 23, a second source 241, and a second drain 242.

In one embodiment, a light-sensitive sensor S is also provided, which includes the following.

A third metal layer 21 is disposed on the planarization layer 19. The third metal layer 21 includes the second gate 211 and a first metal section 212. Material of the third metal layer 21 may be the same as that of the second metal layer 18.

The second insulating layer 22 is disposed on the third metal layer 21. Material of the second insulating layer 22 may include be selected from a group consisting of silicon nitride, silicon oxide, and organic photoresist.

Figure 2:
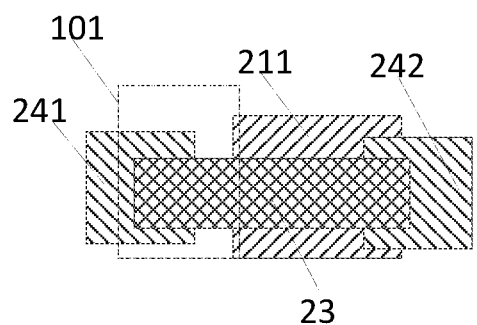
FIG. 2 is a top view of a light-sensitive sensor of the embodiment of the present disclosure.

The second semiconductor layer 23 is disposed on the second insulating layer 22. The second semiconductor layer 23 includes conductive portions 231, and the conductive portions 231 are disposed at both ends of the second semiconductor layer 23. As shown in FIG. 1 and FIG. 2, an orthographic projection of the second semiconductor layer 23 on a setup plane partially overlaps an orthographic projection of the second gate 211 on the setup plane. The setup plane is a horizontal plane. That is, from bottom to top, the second gate 211 covers a portion of the second semiconductor layer 23. In a preferred embodiment, the second semiconductor layer 23 may be made of amorphous silicon, and the first semiconductor layer 14 may be made of polysilicon. Since the amorphous silicon can be made thicker, it is good for light absorption and facilitates a formation of a high-performance light-sensitive sensor, thus improving the accuracy of fingerprint recognition. In order to further increase an aperture, in one embodiment, the second semiconductor layer 23 may cover the first semiconductor portion 141.

The fourth metal layer 24 is disposed on the second semiconductor layer 23. The fourth metal layer 24 includes the second source 241 and the second drain 242. The second drain 242 is connected to the control element T1. Specifically, the second drain 242 is connected to a drain (i.e., the first drain 182) of the control element T1. In one embodiment, in order to reduce impedance, the second drain 242 may be connected to the first drain 182 through the first metal section 212. In a preferred embodiment, the second source 241 may cover a portion of the second gate 211.

As shown in FIG. 2, since the gate of the light-sensitive sensor (the amorphous silicon thin film transistor) is not fully covered, there is a gap area 101 between the second gate 211 and the second source 241 that is not controlled by the gate. The gap area 101 is configured to reduce dark current of the light-sensitive sensor, enhance anti-noise performance of the device. Moreover, a gate voltage can be adjusted to enhance the sensitivity of the device. A location of the gap area 101 is not specifically limited.

Figure 3:
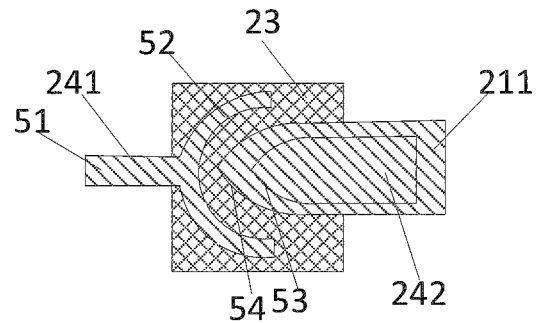
FIG. 3 is a top view of a light-sensitive sensor of a further embodiment of the present disclosure.

In a preferred embodiment, in order to further improve the sensitivity of the light-sensitive sensor, as shown in FIG. 3, the second source 241 includes a first sub-connecting portion 51 and a second sub-connecting portion 52. A shape of the second sub-connecting portion 52 is arc, and a terminal of the first sub-connecting portion 51 is connected to the second sub-connecting portion 52.

A shape of a setup end portion 53 of the second drain 242 is arc, and the shape of the second sub-connecting portion 52 matches the shape of the setup end portion of the second drain 242. The setup end portion is close to the second source 241.

A shape of a setup end portion 54 of the second gate 211 is also arc, and an area of an orthographic projection of the second gate 211 on the base 10 is greater than an area of an orthographic projection of the second drain 242 on the base 10. The second sub-connecting portion 52 surrounds the setup end portion 54 of the second gate 211. That is, the second sub-connecting portion 52 is disposed outside the setup end portion 54 of the second gate 211.

Figure 4:
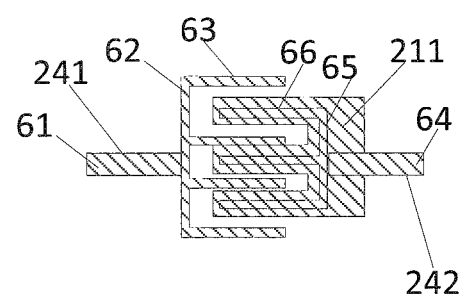
FIG. 4 is a top view of a light-sensitive sensor of a further embodiment of the present disclosure.

In another embodiment, in order to further improve the sensitivity of the light-sensitive sensor, as shown in FIG. 4, the second source 241 includes a first common terminal 61, a first trunk 62, and a plurality of first branches 63. The first trunk 62 is connected to one end of each of the first branches 63 and the first common terminal 61. The first common terminal 61 and the first branches 63 are arranged along a first direction. The first trunk 62 is arranged along a second direction. The first direction intersects the second direction.

The second drain 242 includes a second common terminal 64, a second trunk 65, and a plurality of second branches 66. The second trunk 65 is connected to the second common terminal 64 and one end of each of the second branches 66. The second common terminal 64 and the second branches 66 are arranged along the first direction. The second trunk 65 is arranged along the second direction. Also, the first branches 63 and the second branches 65 are alternately arranged.

The second gate 211 covers the second trunk 65, the second branches 66, and a portion of the second common terminal 64. In one embodiment, a shape of the second gate 211 matches a shape of the second drain 242. The second gate 211 may include a third trunk and a plurality of third branches. One end of each of the third branches is connected to the third trunk.

In one embodiment, as shown in FIG. 1, in order to further improve an integration of the array substrate and reduce an overall thickness, the third metal layer 21 further includes a first touch electrode 213.

In one embodiment, in order to further improve the integration of the array substrate and reduce the overall thickness, the array substrate 100 may further include the following.

A first conductive layer 30 is disposed on the second insulating layer 22. The first conductive layer 30 includes a second touch electrode 31. A position of the first touch electrode 213 corresponds to a position of the second touch electrode 31. In one embodiment, the first touch electrode 213 and the second touch electrode 31 are both grid-shaped. The second touch electrode 31 is connected to the first touch electrode 213. It can be understood that structures of the first touch electrode 213 and the second touch electrode 31 are not limited thereto. In one embodiment, material of the first conductive layer 30 includes, but is not limited to, indium tin oxide.

In one embodiment, in order to simplify a manufacturing process and reduce production costs, the base 10 further includes a switching element T2, and the switching element includes a third drain 183.

In one embodiment, in order to simplify a manufacturing process and reduce production costs, the array substrate 100 further includes a second conductive layer 40. The second conductive layer 40 is disposed on the first conductive layer 30. The second conductive layer 40 includes a pixel electrode 41. The pixel electrode 41 is connected to the drain 183 of the switching element T2. Material of the second conductive layer 40 may be the same as material of the first conductive layer 30.

In one embodiment, in order to simplify a manufacturing process and reduce production costs, the first conductive layer 30 further includes a first electrode plate 32, and the second conductive layer 40 further includes a second electrode plate 42. The second electrode plate 42 corresponds to the first electrode plate 32 and both together form a pixel capacitor.

In a preferred embodiment, the third drain 183 is formed on the second metal layer 18. That is, the drain and a source of the switching element T2 are formed on the same layer as a source and the drain of the control element T1. In addition, a gate of switching element T2 can be formed on the same layer as a gate of control element T1. A semiconductor layer of the switching element T2 can also be formed on the same layer as a semiconductor layer of the control element T1.

Figure 5:
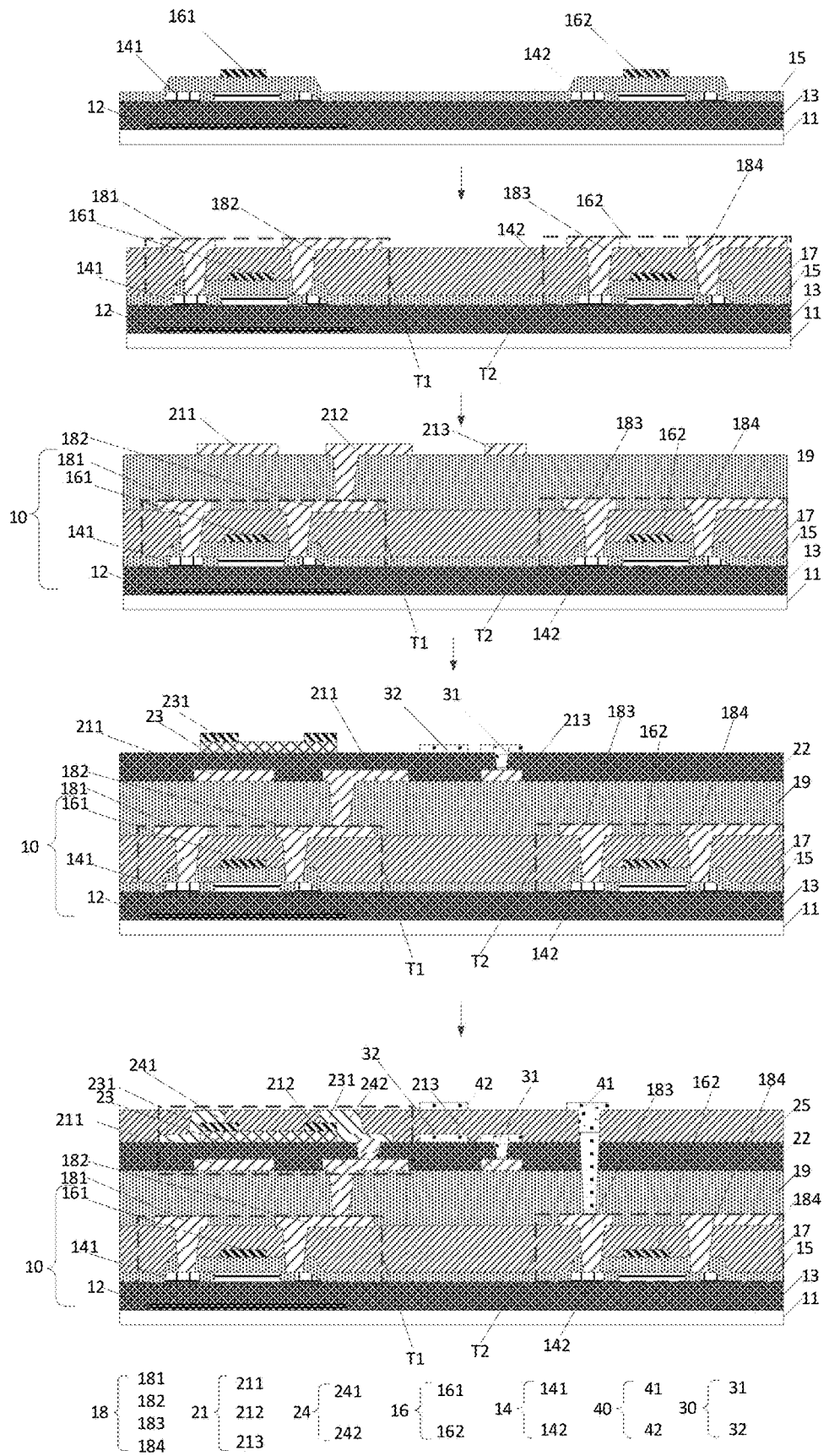
FIG. 5 is a flowchart of a manufacturing method of the array substrate of FIG. 1.

As shown in FIG. 5, in one embodiment, a manufacturing method of an array substrate of this embodiment includes the following.

In a step S101, a light shielding layer 12 is formed on a base substrate 11.

For example, the light shielding layer 12 is patterned by exposure and etching, so that the light shielding layer 12 blocks the first semiconductor portion 141.

In a step S102, a buffer layer 13 and a first semiconductor layer 14 are sequentially formed on the light shielding layer 12.

For example, the first semiconductor layer 14 is made of polysilicon. The first semiconductor layer 14 is exposed and etched to form a first semiconductor portion 141 and a second semiconductor portion 142. Moreover, the first semiconductor portion 141 and the second semiconductor portion 142 are respectively doped with P ions to form N+, so that the first semiconductor portion 141 and the second semiconductor portion 142 are easily in ohmic contact formation.

In a step S103, a first insulating layer 15 and a first metal layer 16 are sequentially deposited on the first semiconductor portion and the second semiconductor portion.

For example, the first metal layer 16 is patterned to form a first gate 161 and a third gate 162. Then, the first semiconductor portion 141 and the second semiconductor portion 142 are respectively implanted with N-ions using a self-aligned process.

In a step S104, a gate insulating layer 17 is deposited on the first metal layer 16.

For example, in one embodiment, the gate insulating layer 17 may be a SiNx/SiOx laminated structure. In one embodiment, rapid thermal annealing may be used for hydrogenation and activation, and then the gate insulating layer 17 is exposed and etched to form source and drain connection holes. The connection holes are connected to the first semiconductor portion 141 or the second semiconductor portion 142.

In a step S105, a second metal layer is deposited in the connection holes and on the gate insulating layer 17.

For example, a second metal layer 18 is patterned to form a first source 181, a first drain 182, a third drain 183, and a third source 184.

In a step S106, a planarization layer 19 is formed on the second metal layer.

For example, the planarization layer is provided with a connection hole, and the first metal section 212 is configured to connect to the first drain 182 through the connection hole.

In a step S107, a third metal layer 21 is deposited on the planarization layer 19.

For example, the third metal layer 21 is patterned to form a second gate 211, the first metal section 212, and a first touch electrode 213.

In a step S108, a second insulating layer 22 is deposited on the third metal layer 21, and a connection hole between the first metal section 212 and a second drain 242 and a connection hole between the first touch electrode 213 and the second touch electrode 31 are formed on the second insulating layer 22.

In a step S109, a second semiconductor layer 23 is deposited on the second insulating layer 22.

The second semiconductor layer 23 is made of a-Si, a surface of the second semiconductor layer 23 is processed to form N+-a-Si, and then the second semiconductor layer is patterned.

In a step S110, a fourth metal layer 24 is formed on the second semiconductor layer 23. The fourth metal layer 24 is patterned to form a second source 241 and the second drain 242.

In a step S111, a first conductive layer 30 is deposited on the second insulating layer 22, and the first conductive layer 30 is patterned to form the second touch electrode 31 and a first electrode plate 32.

In a step S112, a third insulating layer 25 and a second conductive layer 40 are sequentially deposited on the first conductive layer 30.

For example, the third insulating layer 25 is provided with a connection hole, and the connection hole is configured to connect a pixel electrode 41 and the third drain 183.

The second conductive layer 40 is patterned to form the pixel electrode 41 and a second electrode plate 42.

Since the light-sensitive sensor S is formed on the control element T1, metal traces connected to the light-sensitive sensor can be reduced, thereby increasing an aperture. In addition, since a absorption coefficient of a photosensitive layer of amorphous silicon is much better than that of polysilicon, the sensitivity of the light-sensitive sensor is increased.

Figure 6:
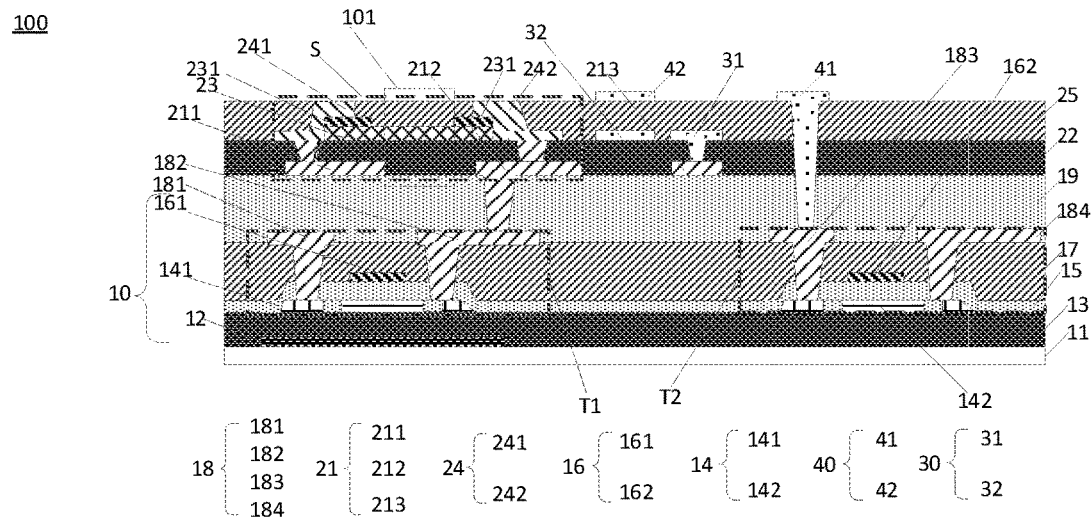
FIG. 6 is a schematic diagram of an array substrate of a further embodiment of the present disclosure.

Please refer to FIG. 6, which is a schematic diagram of an array substrate of a further embodiment of the present disclosure.

As shown in FIG. 6, a difference between a light-sensitive sensor of this embodiment and the light-sensitive sensor of the previous embodiment is that a second gate 211 is connected to a second source 241 of this embodiment.

Since the second gate 211 is connected to the second source 241, an impedance is further reduced, thereby improving the sensitivity of the light-sensitive sensor.

An embodiment of the present disclosure also provides an array substrate, which includes the above-mentioned light-sensitive sensor.

Figure 7:
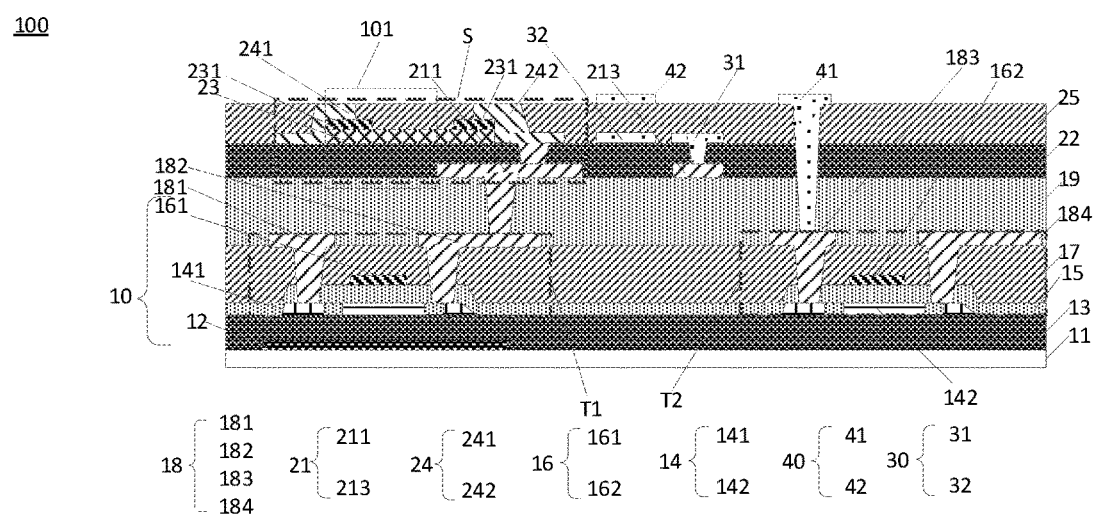
FIG. 7 is a schematic diagram of an array substrate of a further embodiment of the present disclosure.

Please refer to FIG. 7, which is a schematic diagram of an array substrate of a further embodiment of the present disclosure.

A difference between a light-sensitive sensor in this embodiment and the light-sensitive sensor in the first embodiment is that an area of a second gate 211 in this embodiment is greater.

As shown in FIG. 7, in order to simplify a manufacturing process and reduce production costs, a second drain 242 covers a portion of the second gate 211. That is, an area of an orthographic projection of the second gate 211 on a base substrate 11 is greater than an area of an orthographic projection of the second drain 242 on the base substrate 11. Furthermore, the orthographic projection of the second gate 211 on the base substrate 11 partially overlaps an orthographic projection of a second semiconductor layer 23 on the base substrate 11. In addition, the second gate 211 also covers a portion of a first drain 182. That is, the second gate also serves as a first metal section.

An embodiment of the present disclosure also provides an array substrate, which includes the above-mentioned light-sensitive sensor.

It can be understood that FIG. 2 to FIG. 7 only show schematic diagrams of one of the embodiments, but they do not limit the present disclosure. The array substrate in the foregoing embodiments includes all the technical solutions of the foregoing light-sensitive sensors, and therefore can achieve all the foregoing technical effects, which will not be repeated here.

Figure 8:
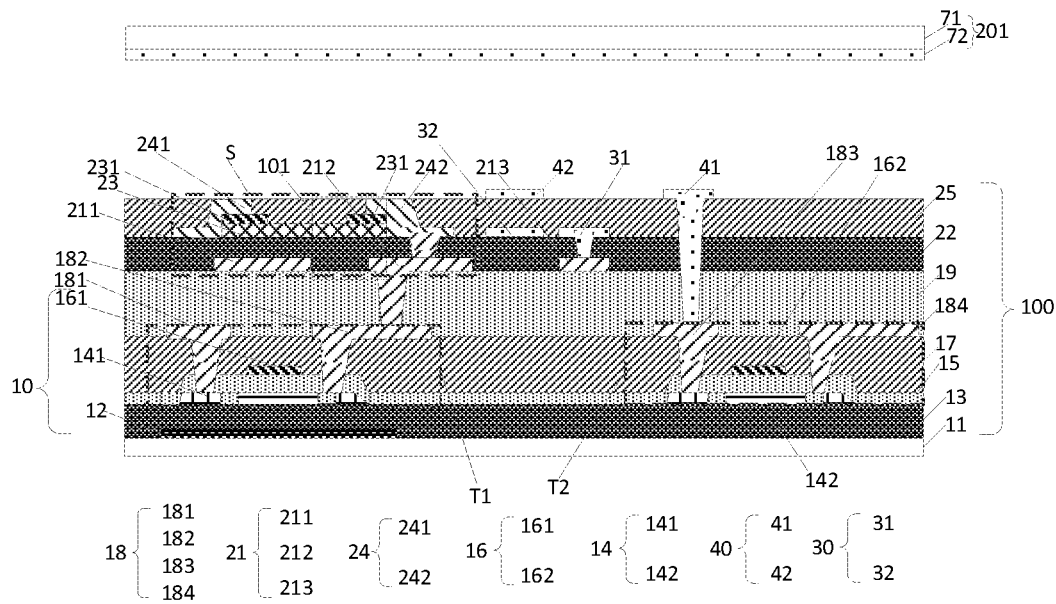
FIG. 8 is a schematic diagram of a display panel of an embodiment of the present disclosure.

As shown in FIG. 8, an embodiment also provides a display panel 200, which includes any of one of the array substrates 100 described above. The display panel 200 may further include a second substrate 201. The second substrate 201 is disposed opposite to the array substrate 100. The display panel 200 may be a liquid crystal display panel. A liquid crystal layer (not shown in the figures) is also disposed between the array substrate 100 and the second substrate 201. In addition, a sealant may be disposed between the array substrate 100 and the second substrate 201 for bonding the array substrate 100 and the second substrate 201. In an embodiment, the second substrate 201 may include a second base substrate 71 and a second electrode 72. In another embodiment, the second substrate 201 may be a color filter substrate, that is, the second substrate 201 may further include a color filter layer. It can be understood that the structure of the second substrate 201 is not limited thereto.

Figure 9:
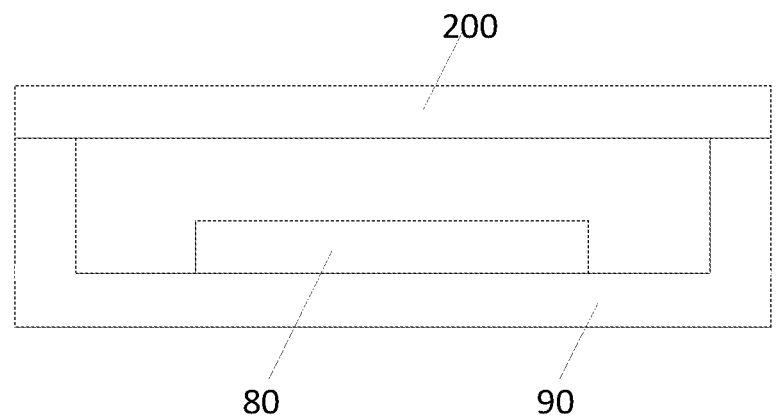
FIG. 9 is a schematic diagram of an electronic equipment of an embodiment of the present disclosure.

Please refer to FIG. 9, which is a schematic diagram of an electronic equipment of an embodiment of the present disclosure.

An electronic equipment 300 may include a display panel 200, a control circuit 80, and a housing 90. It should be noted that the electronic equipment 300 shown in FIG. 9 is not limited to the above content, and it may also include other devices, for example, it may also include a camera, an antenna structure, a fingerprint unlocking module, and the like.

The display panel 200 is disposed on the housing 90.

In some embodiments, the display panel 200 may be fixed to the housing 90, and the display panel 200 and the housing 90 together form a closed space to accommodate components such as the control circuit 80.

In some embodiments, the housing 90 may be made of a flexible material, such as a plastic housing or a silicone housing.

The control circuit 80 is installed in the housing 90, the control circuit 80 may be a main board of the electronic equipment 300, and the control circuit 80 may be integrated with one, two or more of functional components such as a battery, an antenna structure, a microphone, a speaker, a headphone interface, a universal serial bus interface, a camera, a distance sensor, an ambient light sensor, a receiver, and a processor.

The display panel 200 is installed in the housing 90. Also, the display panel 200 is electrically connected to the control circuit 80 to form a display surface of the electronic equipment 300. The display panel 200 may include a display area and a non-display area. The display area can be configured to display an image of the electronic equipment 300 or used for a user to perform a touch control. The non-display area can be configured to set various functional components.

The electronic equipment includes, but is not limited to, mobile phones, tablet computers, computer monitors, game consoles, televisions, display screens, wearable devices, and other domestic appliances or household appliances with display functions.

The light-sensitive sensor, the array substrate, and the electronic equipment of the embodiments of the present disclosure include the third metal layer, the second insulating layer, the second semiconductor layer, and the fourth metal layer. The third metal layer includes the second gate. The second insulating layer is disposed on the third metal layer. The second semiconductor layer is disposed on the second insulating layer. The second semiconductor layer includes the conductive portions, and the conductive portions are disposed at both ends of the second semiconductor layer. The second gate covers a portion of the second semiconductor layer. The fourth metal layer is disposed on the second semiconductor layer. The fourth metal layer includes the second source and the second drain. Since there is a gap area between the second gate and the second source and/or the second drain that is not controlled by the gate, dark current of the light-sensitive sensor is reduced, anti-noise performance and sensitivity of the device are enhanced, and the accuracy of the fingerprint recognition is improved.

The light-sensitive sensor, the array substrate, and the electronic equipment of the embodiments of the present disclosure have been introduced in detail above. In this specification, specific examples are used to illustrate the principle and implementations of the present disclosure, and the foregoing description of the embodiments is intended only to help understand the present disclosure. In addition, a person of ordinary skill in the art may make modifications in terms of the specific implementations and the application range according to ideas of the present disclosure. In conclusion, the content of this specification shall not be construed as a limitation on the present disclosure.

What is claimed is:

1. A light sensor, comprising:
    a third metal layer comprising a second gate;
    a second insulating layer disposed on the third metal layer;
    a second semiconductor layer disposed on the second insulating layer; wherein the second semiconductor layer comprises conductive portions, and the conductive portions are disposed at both ends of the second semiconductor layer; and
    a fourth metal layer disposed on the second semiconductor layer, wherein the fourth metal layer comprises a second source and a second drain,
    wherein there is a gap between an orthographic projection of the second gate on a set plane and an orthographic projection of at least one of the second source or the second drain on the set plane.

2. The light sensor as claimed in claim 1, wherein the second source covers a portion of the second gate.

3. The light sensor as claimed in claim 2, wherein the second gate is connected to the second source.

4. The light sensor as claimed in claim 2, wherein an orthographic projection of the second drain on the set plane and the orthographic projection of the second gate on the set plane do not overlap.

5. The light sensor as claimed in claim 1, wherein the second drain covers a portion of the second gate.

6. The light sensor as claimed in claim 5, wherein an orthographic projection of the second source on the set plane and the orthographic projection of the second gate on the set plane do not overlap.

7. The light sensor as claimed in claim 1, wherein the second source comprises a first sub-connecting portion and a second sub-connecting portion, and a terminal of the first sub-connecting portion is connected to the second sub-connecting portion;
    wherein a shape of a set end portion of the second drain is arc, a shape of the second sub-connecting portion matches the shape of the set end portion of the second drain, and the set end portion of the second drain is close to the second source; and
    wherein a shape of a set end portion of the second gate is also arc, an area of an orthographic projection of the second gate on a base is greater than an area of an orthographic projection of the second drain on the base; the second sub-connecting portion surrounds the set end portion of the second gate.

8. The light sensor as claimed in claim 1, wherein the second source comprises a first common terminal, a first trunk, and a plurality of first branches, the first trunk is connected to the first common terminal and one end of each first branch, the first common terminal and the first branches are arranged along a first direction, and the first trunk is arranged along a second direction;
    wherein the second drain comprises a second common terminal, a second trunk, and a plurality of second branches, the second trunk is connected to the second common terminal and one end of each second branch, the second common terminal and the second branches are arranged along the first direction, the second trunk is arranged along the second direction, and the first branches and the second branches are arranged alternately; and wherein the second gate covers the second trunk, the second branches, and a portion of the second common terminal, and the first direction intersects the second direction.

9. An array substrate, comprising:
a base comprising a control element; and
a light sensor comprising:
   a third metal layer comprising a second gate;
   a second insulating layer disposed on the third metal layer;
   a second semiconductor layer disposed on the second insulating layer;
   wherein the second semiconductor layer comprises conductive portions, and the conductive portions are disposed at both ends of the second semiconductor layer; and
   a fourth metal layer disposed on the second semiconductor layer, wherein the fourth metal layer comprises a second source and a second drain, and the second drain of the light sensor is connected to the control element,
   wherein there is a gap between an orthographic projection of the second gate on a set plane and an orthographic projection of at least one of the second source or the second drain on the set plane.

10. The array substrate as claimed in claim 9, wherein the control element comprises a first drain; and
   wherein the third metal layer further comprises a first metal section, and the second drain is connected to the first drain through the first metal section.

11. The array substrate as claimed in claim 9, wherein the second semiconductor layer covers a semiconductor layer of the control element.

12. The array substrate as claimed in claim 9, wherein material of a semiconductor layer of the control element comprises polysilicon, and material of the second semiconductor layer comprises amorphous silicon.

13. The array substrate as claimed in claim 9, wherein the third metal layer comprises a first touch electrode, and the array substrate further comprises:
   a first conductive layer disposed on the second insulating layer, the first conductive layer comprises a second touch electrode, and a position of the second touch electrode corresponds to a position of the first touch electrode.

14. The array substrate as claimed in claim 13, wherein the base further comprises a switching element, and the array substrate further comprises:
   a second conductive layer disposed on the first conductive layer, the second conductive layer comprises a pixel electrode, and the pixel electrode is connected to a drain of the switching element.

15. The array substrate as claimed in claim 14, wherein the first conductive layer further comprises a first electrode plate; and
   wherein the second conductive layer further comprises a second electrode plate, and a position of the first electrode plate corresponds to a position of the second electrode plate.

16. The array substrate as claimed in claim 9, wherein the second source covers a portion of the second gate.

17. The array substrate as claimed in claim 9, wherein the second gate is connected to the second source.

18. The array substrate as claimed in claim 9, wherein the second drain covers a portion of the second gate.

19. The array substrate as claimed in claim 18, wherein an orthographic projection of the second source on the set plane and the orthographic projection of the second gate on the set plane do not overlap.

20. An electronic equipment, comprising the array substrate as claimed in claim 9.

* * * * *